(12) United States Patent
Gianchandani et al.

(10) Patent No.: US 9,726,557 B2
(45) Date of Patent: Aug. 8, 2017

(54) MAGNETOELASTIC STRAIN SENSOR

(71) Applicant: The Regents of the University of Michigan, Ann Arbor, MI (US)

(72) Inventors: Yogesh Gianchandani, Ann Arbor, MI (US); Venkatram Pepakayala, Ann Arbor, MI (US); Scott Green, South Lyon, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 19 days.

(21) Appl. No.: 14/531,418

(22) Filed: Nov. 3, 2014

(65) Prior Publication Data
US 2015/0122044 A1    May 7, 2015

Related U.S. Application Data

(60) Provisional application No. 61/898,816, filed on Nov. 1, 2013.

(51) Int. Cl.
| | |
|---|---|
| *G01L 1/00* | (2006.01) |
| *G01B 7/16* | (2006.01) |
| *G01M 5/00* | (2006.01) |
| *G01L 1/12* | (2006.01) |
| *H01L 41/12* | (2006.01) |

(52) U.S. Cl.
CPC .............. *G01L 1/12* (2013.01); *H01L 41/125* (2013.01)

(58) Field of Classification Search
None
See application file for complete search history.

(56) References Cited

U.S. PATENT DOCUMENTS

| | | | | |
|---|---|---|---|---|
| 4,448,546 A * | 5/1984 | Paros | ........................ | G01K 7/32 310/361 |
| 4,459,042 A * | 7/1984 | Paros | ........................ | G01K 7/32 310/341 |
| 7,113,876 B2 * | 9/2006 | Zeng | .................... | G01N 29/032 324/236 |
| 7,261,005 B2 * | 8/2007 | Bunyer | .................. | G01L 3/105 73/722 |
| 7,626,502 B2 * | 12/2009 | Li | ........................ | G08B 13/2434 340/572.1 |
| 7,759,134 B2 * | 7/2010 | Chin | .................... | G01N 27/745 422/50 |
| 8,136,408 B2 * | 3/2012 | Arms | ........................ | G01B 7/16 73/765 |

(Continued)

FOREIGN PATENT DOCUMENTS

IT    WO 03016891 A2 *    2/2003    ............... G01B 7/24

*Primary Examiner* — Peter Macchiarolo
*Assistant Examiner* — Jermaine Jenkins
(74) *Attorney, Agent, or Firm* — Reising Ethington P.C.

(57)    ABSTRACT

A strain sensor having an active area that includes a magnetoelastic resonator and spring configured so that the spring undergoes a greater amount of strain than the resonator when the sensor is under load. The sensor is anchored at opposite ends of the active area to a substrate for which strain is to be measured. An interrogating coil is used for wireless sensor readout. A biasing magnet may be included to provide a desired sensor response for the particular application of the sensor. The strain sensor may be implemented as a differential strain sensor that includes a second, strain-independent reference resonator.

20 Claims, 12 Drawing Sheets

(56) References Cited

U.S. PATENT DOCUMENTS

| | | | | |
|---|---|---|---|---|
| 8,310,134 B2* | 11/2012 | Ajayan | ................ | H01L 41/113 |
| | | | | 310/357 |
| 8,707,793 B2* | 4/2014 | Nopper | ................ | G01L 9/0004 |
| | | | | 73/722 |
| 8,914,910 B1* | 12/2014 | Sadeghian Marnani | ................ | G01Q 40/00 |
| | | | | 850/19 |
| 9,086,338 B2* | 7/2015 | Shinobu | ................... | G01N 5/02 |
| 2009/0099442 A1* | 4/2009 | Paden | ...................... | A61B 3/16 |
| | | | | 600/398 |
| 2009/0302498 A1* | 12/2009 | Nedestam | ............... | A61F 13/42 |
| | | | | 264/263 |
| 2011/0232392 A1* | 9/2011 | Suess | ........................ | G01L 1/10 |
| | | | | 73/779 |

\* cited by examiner

MAGNETOELASTIC STRAIN SENSOR

CROSS-REFERENCE TO RELATED APPLICATION

This application claims the benefit of U.S. Provisional Ser. No. 61/898,816 filed on Nov. 1, 2013, the entire contents of which are hereby incorporated by reference.

STATEMENT REGARDING FEDERALLY FUNDED RESEARCH

This invention was made with government support under FD-U-003787 awarded by the Department of Health and Human Services/Food and Drug Administration. The Government has certain rights in the invention.

BACKGROUND

Strain gauges are useful in various civil, industrial, and medical applications to measure or monitor mechanical strain in bridges and other infrastructure, aerospace components, and medical prostheses, to name a few. Typical strain gauges are made from metal foils that require an interface with other electronic equipment and a power source. Wireless strain sensors that can be remotely accessed are attractive for some applications. An example is in vivo monitoring of medical implants, where a wireless approach is often the only practical way to obtain strain measurements over long periods. Some sensors are powered sensors and require a battery and/or an energy harvesting system to operate. Other sensors are passive sensors that do not require a built-in power source to operate. Passive sensors can be simpler and more robust than their powered counterparts. Various techniques have been investigated for use in passive strain sensing, including the use of inductive coupling, radio frequency (RF) electromagnetic backscattering, surface acoustic waves, and optical methods.

Magnetoelastic materials have been proposed for use in wireless sensing applications to measure mass loading, viscosity, fluid flow, pressure, position, and other parameters. In the presence of a magnetic field, a magnetoelastic material exhibits the Joule magnetostriction effect, in which the magnetic field induces strain in the material. Conversely, when subjected to an applied strain, a magnetoelastic material exhibits the Villari effect, in which the applied strain induces magnetization in the material. Both of these effects include the rotation of magnetic moments within the material. Joule magnetostriction is moment rotation under the applied magnetic field, and the Villari effect is moment rotation under the applied strain. When an alternating magnetic field is applied to a magnetoelastic material, mechanical vibration is induced via the Joule effect and results in strain-induced material magnetization via the Villari effect. The use of magnetoelastic materials in strain sensors has been limited.

SUMMARY

In accordance with one embodiment of the invention there is provided a strain sensor comprising a magnetoelastic material and configured so that the strain in an active area of the sensor is non-uniform. In at least some embodiments, the strain sensor may include a resonator comprising the magnetoelastic material and a compliance element coupled with the resonator and configured so that the compliance element undergoes a greater amount of strain than the resonator when the active area of the sensor is under load. The resonator and the compliance element may have different shapes, and the compliance element may comprises the magnetoelastic material. In some embodiments, the resonator and compliance element can be arranged along a longitudinal direction, with the compliance element comprising a spring having a lower stiffness or spring constant in the longitudinal direction than the resonator. In some embodiments, the strain sensor may be a differential strain sensor that also includes a strain-independent reference resonator.

In accordance with another embodiment of the invention there is provided a method of measuring strain at an area of a structure, comprising the step of measuring the response of an active area of a strain sensor at a frequency of interest, wherein the strain sensor is attached to the area of the structure and the active area of the strain sensor comprises a magnetoelastic material and exhibits non-uniform strain. An active area of the strain sensor may be magnetically biased depending upon the sensor characteristics desired for a particular application.

BRIEF DESCRIPTION OF THE DRAWINGS

Preferred exemplary embodiments of the invention will hereinafter be described in conjunction with the appended drawings, wherein like designations denote like elements, and wherein.

DESCRIPTION OF THE ILLUSTRATED EMBODIMENTS

One phenomenon observed in magnetoelastic materials is a magnetization-induced change in the Young's modulus of the material, referred to as the $\Delta E$ effect. This phenomenon can be exploited to provide strain dependence to the resonant frequency of the material. The $\Delta E$ effect has been limited for use in strain sensors due to the tendency for the magnetoelastic material to become magnetically saturated at very low strains, such as 50 μstrain or less. At higher strains, no further change in the magnetic properties of the magnetoelastic material is detectable, thus limiting the dynamic range of $\Delta E$ effect magnetoelastic strain sensors.

The strain sensor described below exploits the $\Delta E$ effect of magnetoelastic materials in a manner that provides a broader and a more useful dynamic range. A compliance element is employed to accommodate a portion of the applied strain, effectively increasing the useful range of the sensor by preventing magnetic saturation of the magnetoelastic material at low applied strains. Further, the compliance element can be used to tune the sensor by balancing the dynamic range with the sensitivity of the sensor, depending on the particular requirements of the application.

Figure 1:
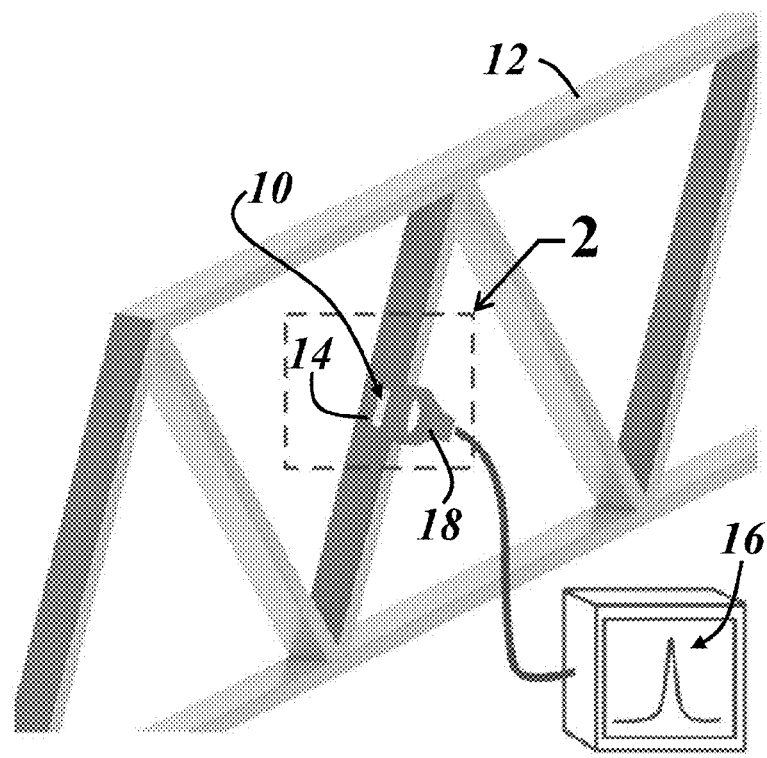
FIG. 1 depicts an embodiment of a strain sensor constructed in accordance with the invention, showing it attached to a structure for which strain is to be measured, along with interrogation coils and computing equipment to measure and determine strain-induced characteristics of the strain sensor.

As shown in FIG. 1, the strain sensor 10 can be attached to a structure 12 at an area 14 where it is desired to measure or monitor strain in the structure. In this example, the strain sensor 10 is a wireless, passive sensor. A resonant response 16 of the sensor is detected wirelessly via interrogation coils 18 and can be observed as a peak in the frequency spectrum of the coil voltage. The peak represents a resonant frequency, and the resonant frequency is a function of strain.

Figure 2:
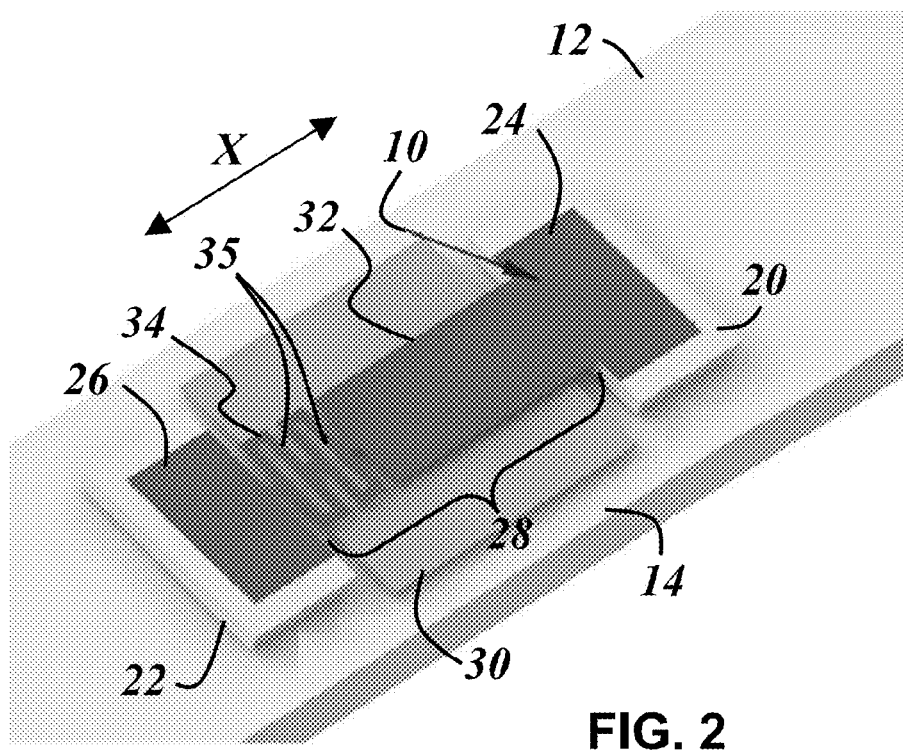
FIG. 2 shows a magnetoelastic strain sensor such as can be used in FIG. 1 that includes a strain responsive active region.

FIG. 2 illustrates one embodiment of the strain sensor 10 attached to the structure 12. The sensor 10 is suspended over the desired area 14 of the structure 12 and extends between first and second supports 20, 22 that space the sensor away from the surface of the structure. The sensor 10 includes first and second anchors 24, 26 and an active area 28 extending between the anchors. The anchors 24, 26 are rigidly attached to the structure 12 via the supports 20, 22 for movement with the structure. The active area 28 is the portion of the sensor 10 that undergoes strain substantially matching that of the area of interest 14. The illustrated strain sensor 10 is oriented to measure strain in the X-direction. In the illustrated example, a biasing magnet 30 is also installed with the sensor 10, the operation of which is described in greater detail below.

The strain sensor 10 comprises a magnetoelastic material and is shaped so that the strain in the active area 28 of the sensor is non-uniform. In other words, when the sensor 10 is subjected to an applied strain, one portion of the active area 28 is subjected to a larger fraction of the applied strain than another portion. In the illustrated example, the active area 28 includes a resonator 32 and a compliance element 34 coupled with the resonator. The resonator 32 includes the magnetoelastic material and is a flat strip of magnetoelastic material in this example. The compliance element 34 is shaped different from the resonator so that it undergoes a greater amount of strain than the resonator 32 when the active area 28 of the sensor 10 is strained. In the example of FIG. 2, the resonator 32 and the compliance element 34 are coupled in an end-to-end arrangement with respective opposite ends of the resonator and compliance element attached to the supports 20, 22. In one embodiment, the sensor 10, including the anchors 24, 26, the resonator 32, and the compliance element 34, is monolithic and formed from a single strip of magnetoelastic material. It is not necessary that the entire sensor 10 be made from magnetoelastic material, however. For instance, the anchors 24, 26 and/or the compliance element 34 may be made from other materials. Other arrangements are possible, and some examples are provided below.

Any crystalline or amorphous magnetoelastic material may be suitable for use in the strain sensor. One example of a commercially available crystalline magnetoelastic material is Terfenol-D (Etrema Products, Inc., Ames, Iowa, USA). Amorphous magnetoelastic materials may be preferred in certain applications for a variety of reasons, such as commercial availability in thin sheet form, relatively low bias field requirements, and better strength and ductility than currently available crystalline magnetoelastic materials. While crystalline rare-earth magnetoelastic alloys such as Terfenol-D demonstrate excellent magnetostriction, they have relatively low tensile strength, can be brittle, and can require bias fields on the order of hundreds of oersteds. Certain amorphous magnetoelastic materials, such as Metglas 2826MB ($Fe_{40}Ni_{38}Mo_4B_{18}$) (Metglas, Inc., Conway, S.C., USA) can be operated with a biasing field of only a few oersteds. This low bias field requirement allows the use of smaller magnets and an overall smaller sensor. The Metglas material is available in foils measuring 28 μm thick, and it can be micromachined using micro-electrodischarge machining (μEDM) or photochemical machining (PCM). It has a saturation magnetostriction of 12 ppm and a DC permeability greater than 50,000. The high permeability can serve to attract and direct the magnetic biasing field along the sensor, so the bias field need not be perfectly aligned with the sensor. Amorphous materials can also be tailored to have a high magnetomechanical coupling coefficient (i.e. higher efficiency for conversion of magnetic energy to mechanical energy, and vice-versa) through the process of annealing in a magnetic field, which can be advantageous in the strain sensor. The $\Delta E$ effect in amorphous magnetoelastic materials can also be modified by annealing under varying temperature and magnetic field conditions.

The compliance element 34 acts as a spring having a lower stiffness or spring constant in the X-direction than the resonator 32 and can have any shape and be made from any material that provides this characteristic. In the example of FIG. 2, the compliance element 34 is shaped so that the differences in its characteristics from the resonator 32 are somewhat minimized in other (non-X) directions and in other modes. For instance, the overall width W and thickness of the compliance element 34 is the same as the resonator 32. In this example, the active area 28 of the sensor 10 may be alternatively viewed as a strip of magnetoelastic material with relief areas 35 formed in the strip. Here, the relief areas 35 are in the form of cut-outs along edges of the strip and cut-outs contained within the width of the strip, but any relief area that locally reduces the effective cross-sectional area of the strip or otherwise locally reduces the stiffness of the strip in the X-direction may be employed. In other embodiments, the compliance element 34 is formed from a material having an intrinsically lower stiffness than the resonator 32, and relief areas are not necessary.

Figure 3:
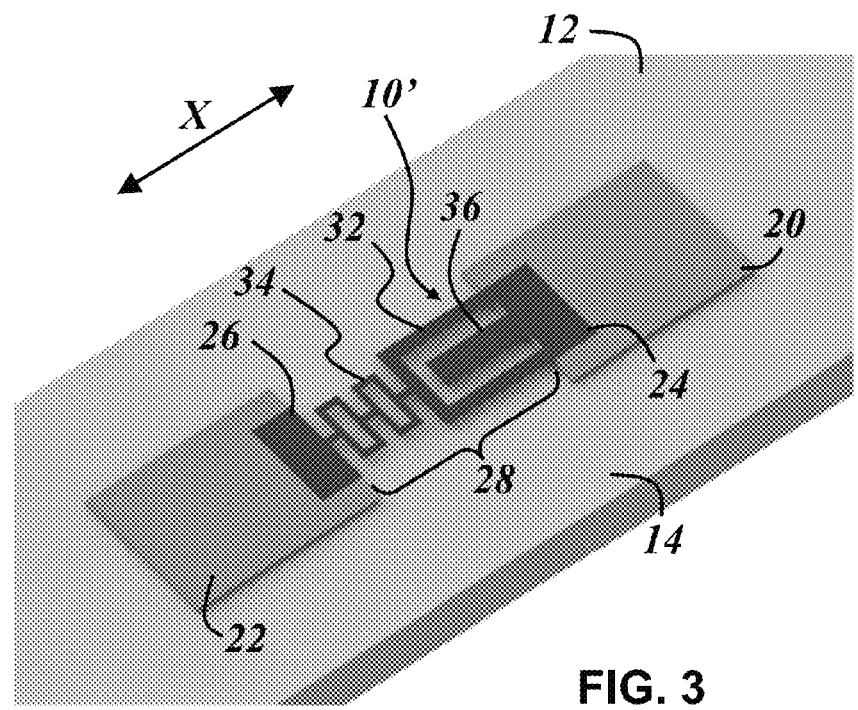
FIG. 3 shows another embodiment of a magnetoelastic strain sensor such as can be used in FIG. 1 that includes a strain responsive active region along with a reference resonator.

FIG. 3 illustrates another embodiment of the strain sensor 10' that further includes a reference resonator 36. The reference resonator 36 is mechanically isolated from the primary resonator 32 and the compliance element 34 and is thus strain-independent. In this example, the reference resonator 36 is located within the active area 28 of the sensor 10' and is in the form of a cantilever extending from one of the anchors 24. In one embodiment, the reference resonator 36 is formed monolithically with the rest of the sensor from a single strip or piece of magnetoelastic material. The reference resonator 36 may be provided in other forms, extend in other directions, or be located elsewhere and can be used as described further below to compensate for temperature or other variables that affect the magnetoelastic properties of the sensor. In one embodiment, one or both of the supports 20, 22 are biasing magnets or include biasing magnets.

Figure 4:
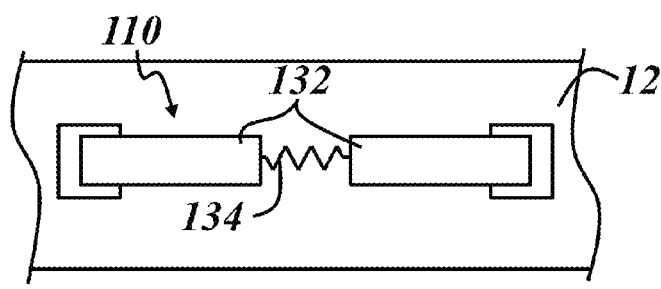
FIGS. 4-6 depict additional embodiments of magnetoelastic strain sensors such as can be used in FIG. 1.
Figure 5:
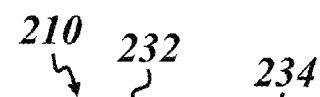
Figure 6:
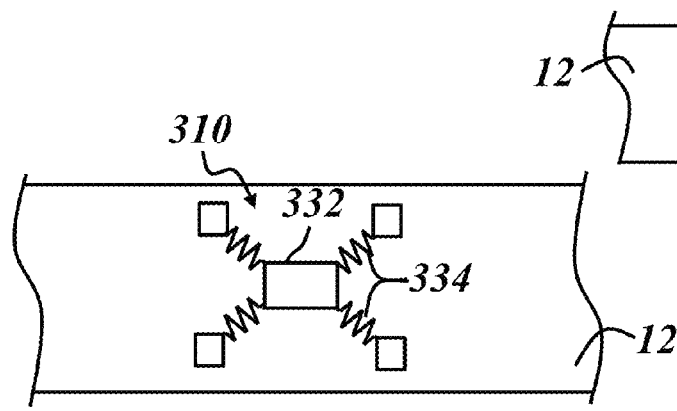

FIGS. 4-6 illustrate some other examples of magnetoelastic strain sensors. FIG. 4 is a top view of an embodiment of the strain sensor 110 including opposing cantilevered resonators 132 coupled with a compliance element 134 (schematically illustrated as a spring) extending between the resonators. FIG. 5 is a side view of an embodiment of the strain sensor 210 where the compliance element 234 is a compliant polymer layer (e.g., an adhesive layer) that couples the resonator 232 with one of the anchors. FIG. 6 illustrates a more complex system demonstrating the flexibility in sensor design enabled by the present disclosure. The strain sensor 310 of FIG. 6 includes multiple compliance elements 334 coupled with a resonator 332 and is capable of measuring strain in multiple directions, for example. Each of the illustrated examples is capable of measuring strain based on a resonant frequency of the sensor that changes with mechanical strain. The principles of operation and experimental examples and results are provided below.

Principles of Operation

The interrogation of resonant magnetoelastic sensors generally involves a small amplitude vibration induced by a sinusoidal stimulation around a bias field. Although magnetostriction is a non-linear phenomenon, the small signal response can be linearized at the bias as expressed by the following pair of equations for a one-dimensional system considering stress and field intensity as the independent variables:

$$\varepsilon = \frac{\partial \varepsilon}{\partial \sigma}\bigg|_H \sigma + \frac{\partial \varepsilon}{\partial H}\bigg|_\sigma H \quad (1)$$

$$B = \frac{\partial B}{\partial \sigma}\bigg|_H \sigma + \frac{\partial B}{\partial H}\bigg|_\sigma H \quad (2)$$

where σ is stress, ε is strain, B is magnetic flux density and H is magnetic field intensity (small signal). The partial derivatives are:

$$\frac{\partial \varepsilon}{\partial \sigma}\bigg|_H$$

is the compliance at constant H, $s^H$;

$$\frac{\partial B}{\partial H}\bigg|_\sigma$$

is the permeability at constant stress, $\mu^\sigma$; and $$\frac{\partial \varepsilon}{\partial H}\bigg|_\sigma$$

and $$\frac{\partial B}{\partial \sigma}\bigg|_H$$

are represented by d, the magnetostrictive coefficient.

Figure 7:
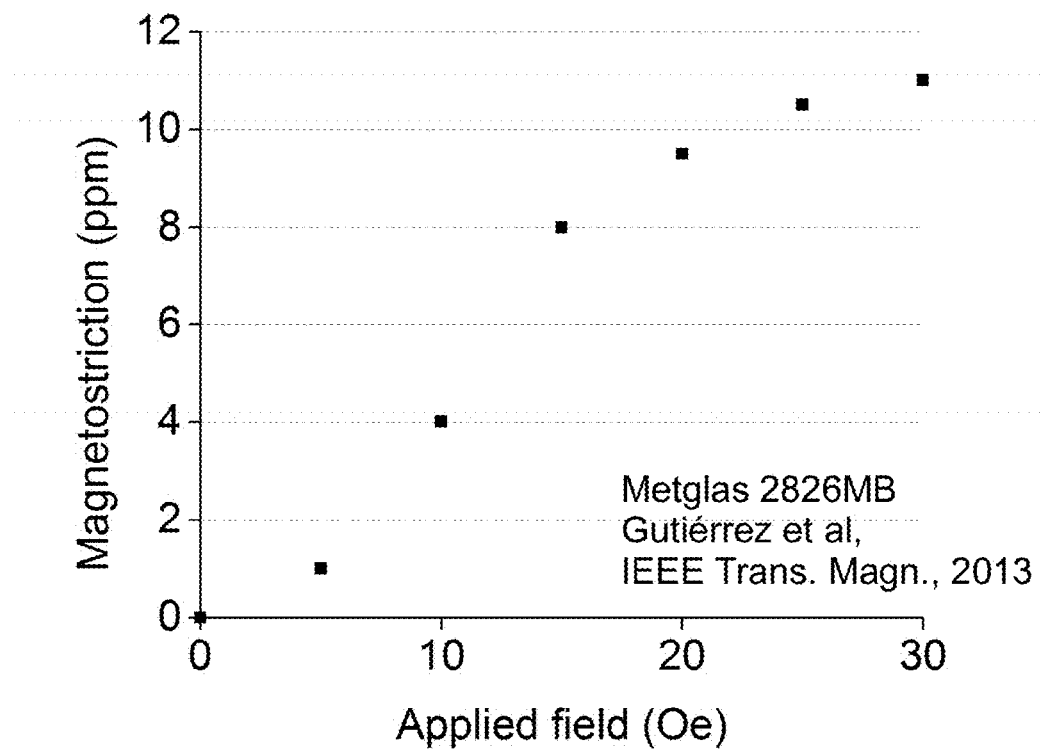
FIG. 7 depicts magnetostriction as a function of applied field for a magnetoelastic material that may be used for the strain sensors of FIGS. 1-6.

The magnetostrictive coefficient, also referred to as the small-signal magnetostrictivity, d, is the slope of the magnetostriction curve as a function of an applied DC magnetic field. The magnetostriction curve for Metglas 2826MB is shown in FIG. 7. A bias field that is too high or too low can result in a low value of d and lower response from the sensor. The bias field may be provided by a permanent magnet placed in proximity to the magnetostrictive material of the sensor (e.g., the biasing magnet 30 of FIG. 2).

Figure 8:
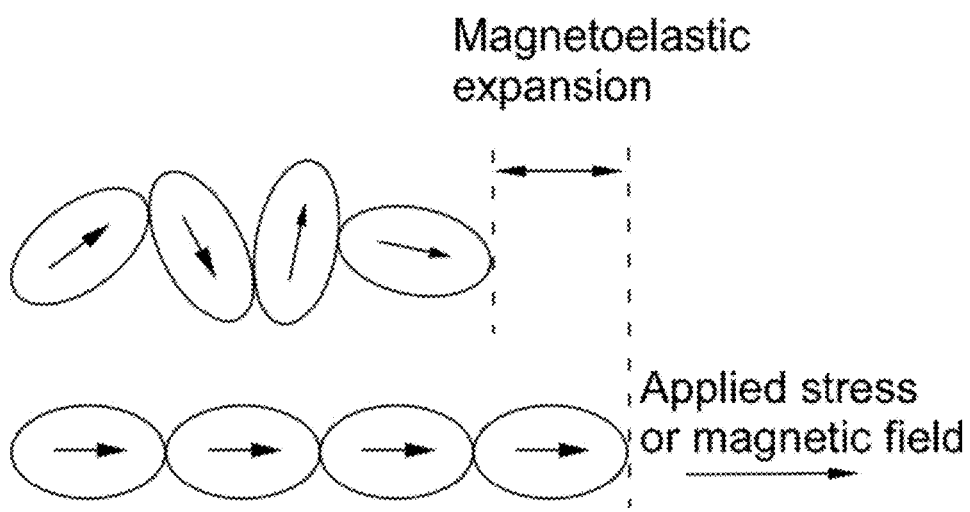
FIG. 8 is a diagram illustrating domain rotation and corresponding magnetoelastic expansion caused by applied strain or magnetic field to a magnetoelastic material.

In a magnetoelastic material under load, strain is produced by two processes: the first is elastic strain (as produced in all materials); the second results from moment rotation caused by the Villari effect. In materials with strong spin-orbit coupling, rotation of magnetic moment results in rotation of electron clouds. If the electron charge cloud is anisotropically shaped, its rotation effectively results in strain. This is shown schematically in FIG. 8, where the arrows show the direction of spontaneous magnetization of the domain below Curie temperature. An ellipsoid of revolution represents magnetostrictive domains in an isotropic magnetoelastic material.

Young's modulus for a magnetoelastic material in the presence of a DC magnetic bias field, $B_0$, can be expressed as:

$$E|_{B_0} = \frac{\sigma}{\varepsilon_{el} + \varepsilon_{mag}} \quad (3)$$

where $\epsilon_{el}$ is the elastic strain and $\epsilon_{mag}$ is the strain due to material magnetization. The $\epsilon_{mag}$ component of strain decreases as the material is exposed to higher stress levels and, consequently, Young's modulus increases. Additionally, if the magnitude of the magnetic field and/or the applied stress is such that the material is magnetically saturated, the only incremental contribution to strain is elastic, and the ΔE effect saturates.

Figure 9:
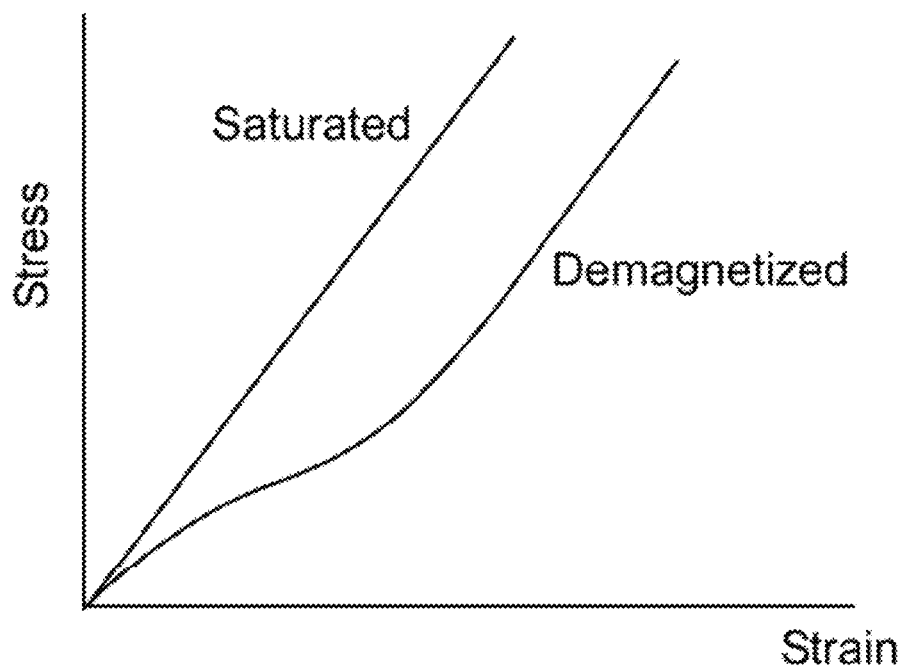
FIG. 9 is a qualitative plot of illustrative stress-strain relationships in a magnetoelastic material.
Figure 10:
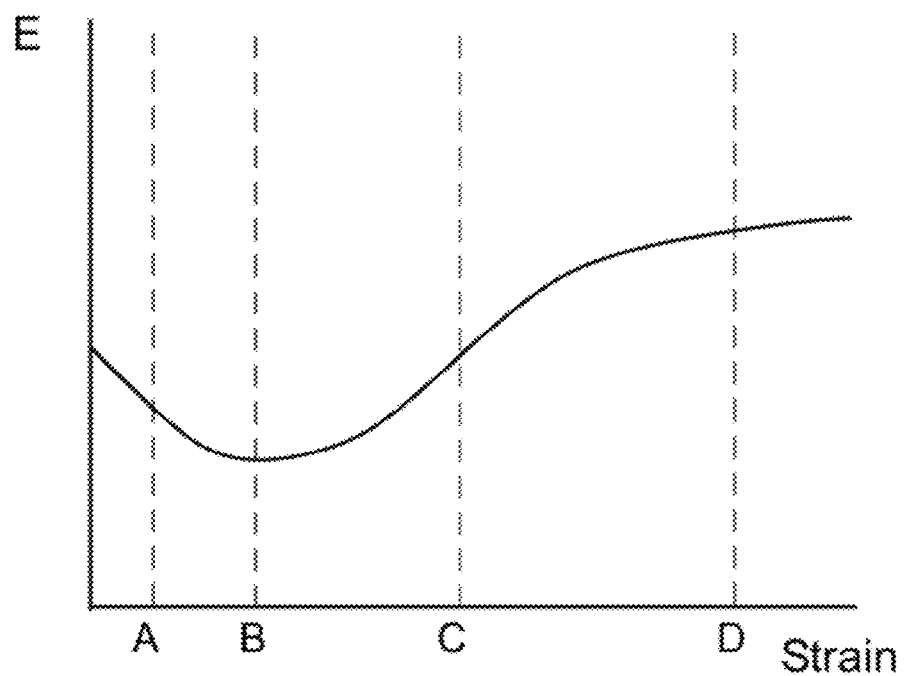
FIG. 10 shows the slope of the demagnetized stress-strain curve (i.e., Young's modulus, E) as a function of stress.

FIG. 9 is a qualitative plot of illustrative stress-strain relationships in a magnetoelastic material, with separate curves for magnetically saturated material and demagnetized material. FIG. 10 shows the slope of the demagnetized stress-strain curve (i.e., Young's modulus, E) as a function of stress. For example, any of points A, B, C, and D could be the baseline operating point of the strain sensor and can be set by the strength of the biasing field. Hence, the biasing magnetic field serves two purposes: determining the small-signal magnetostrictivity, d, and setting the zero-strain operating point of the strain sensor. Tuning the biasing magnetic field (or mechanically pre-stressing the sensor during attachment) shifts the baseline operating point of the sensor. This tunability can be employed to allow measurement of both tensile and compressive strains.

The small amplitude vibration of magnetoelastic materials can be modeled using the coupled magnetomechanical equations (1) and (2). Written in matrix form and rearranging the terms:

$$\vec{\sigma} = [C]\vec{\varepsilon} - \frac{[C][d]^T}{\mu}\vec{B} \quad (4)$$

$$\vec{H} = -\frac{[d][C]}{\mu}\vec{\varepsilon} + \frac{1}{\mu}\vec{B} \quad (5)$$

where $\vec{\sigma}$ is the vectorized stress tensor, [C] is the stiffness matrix, $\vec{\varepsilon}$ is the vectorized strain tensor, [d] is the magnetostrictivity matrix, $\vec{B}$ is the magnetic flux density vector, $\vec{H}$ is the magnetic field intensity vector, and $\mu$ is the permeability. In the following analysis, the model was implemented in COMSOL Multiphysics 4.3 following the approach described by Green et al. ("Wireless Magnetoelastic Monitoring of Biliary Stents," *J. Microelectromechanical Syst.*, vol. 18, no. 1, pp. 64-78, 2009). Equations (4) and (5) were used in frequency domain analysis to obtain magnetoelastic resonance frequencies and mode shapes.

Experimental Devices and Results

Figure 11:
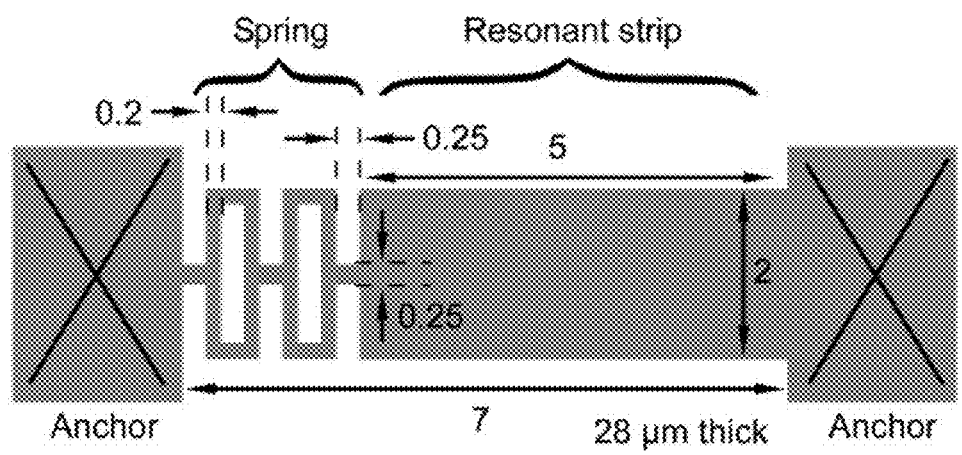
FIG. 11 shows further details of a single strain sensor such as shown in FIG. 2.
Figure 12:
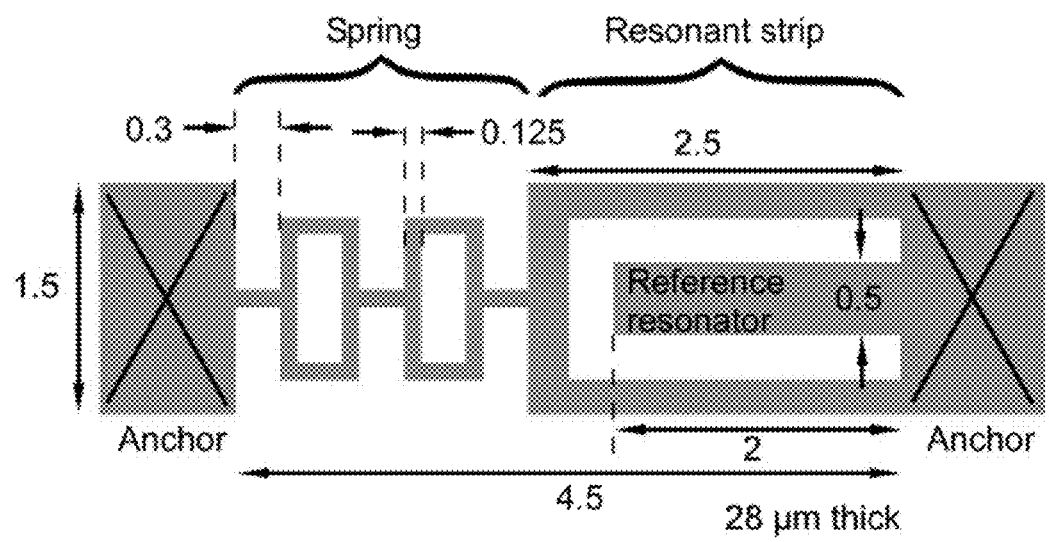
FIG. 12 shows further details of a differential strain sensor such as shown in FIG. 3.

Two embodiments of the strain sensor, similar to those depicted in FIGS. 2 and 3, have been fabricated and evaluated. FIG. 11 illustrates the shape and dimensions of the single strain sensor embodiment, and FIG. 12 illustrates the shape and dimensions of the differential strain sensor embodiment. Both sensors are in the form of a doubly suspended strip of Metglas 2826MB magnetoelastic material. Each sensor includes a resonator (or resonant strip) and a compliance element (or spring). The spring serves to attenuate the strain in the resonant strip to provide a wide dynamic range, as the ΔE effect of magnetoelastic materials typically saturates at strains on the order of a few hundred ppm. Higher strains do not result in any appreciable change in stiffness and consequently no change in resonant frequency.

In the single strain sensor shown in FIG. 11, the resonator is 5 mm×2 mm (10 mm² in area). This area determines the strength of the RF signal transmitted by the resonator. The spring is 2 mm×2 mm (4 mm² in area), and is made with 200 μm wide elements.

In the differential sensor shown in FIG. 12, the resonator is divided into two parallel sections, each measuring 2.5 mm×0.25 mm. The spring element is 2 mm×1 mm. The differential sensor also includes a cantilever reference resonator that is unaffected by any mechanical strain applied to the sensor. Each of the sensors is formed from a single strip of magnetoelastic material with a thickness of 28 μm. The reference resonator of the differential sensor is useful to compensate for the variation in Young's modulus with temperature. This variation can be measured with the reference resonator in the absence of strain.

For small shifts in resonant frequency, Δf, to which a linear approximation can be applied:

$$\left.\frac{\Delta f}{f_0}\right|_{B_0}(\varepsilon, T) \approx S_T(\varepsilon)\Delta\varepsilon + S_\varepsilon(T)\Delta T \quad (6)$$

where $B_0$ is the biasing DC magnetic flux density through the resonating element, assumed to be invariant; $f_0$ is the baseline resonant frequency; and:

$$S_T(\varepsilon) = \frac{\partial}{\partial\varepsilon}\left(\frac{\Delta f}{f_0}\right)_T$$

$$S_\varepsilon(T) = \frac{\partial}{\partial T}\left(\frac{\Delta f}{f_0}\right)_\varepsilon$$

where $S_T(\varepsilon)$ is the sensitivity to strain at constant temperature, and $S_\varepsilon(T)$ is the sensitivity to temperature at constant strain. The term $S_\varepsilon(T)$ at zero strain is obtained from the response of the reference resonator in the differential sensor, whereas the primary resonator of the differential sensor and the single sensor each provide the total sum. Δε must be calculated from the sum. Δε is also dependent on temperature based on the expansion mismatch between the sensor and the substrate to which it is attached. However, the calculated strain does not differentiate between thermal and mechanical sources of strain.

Figure 13:
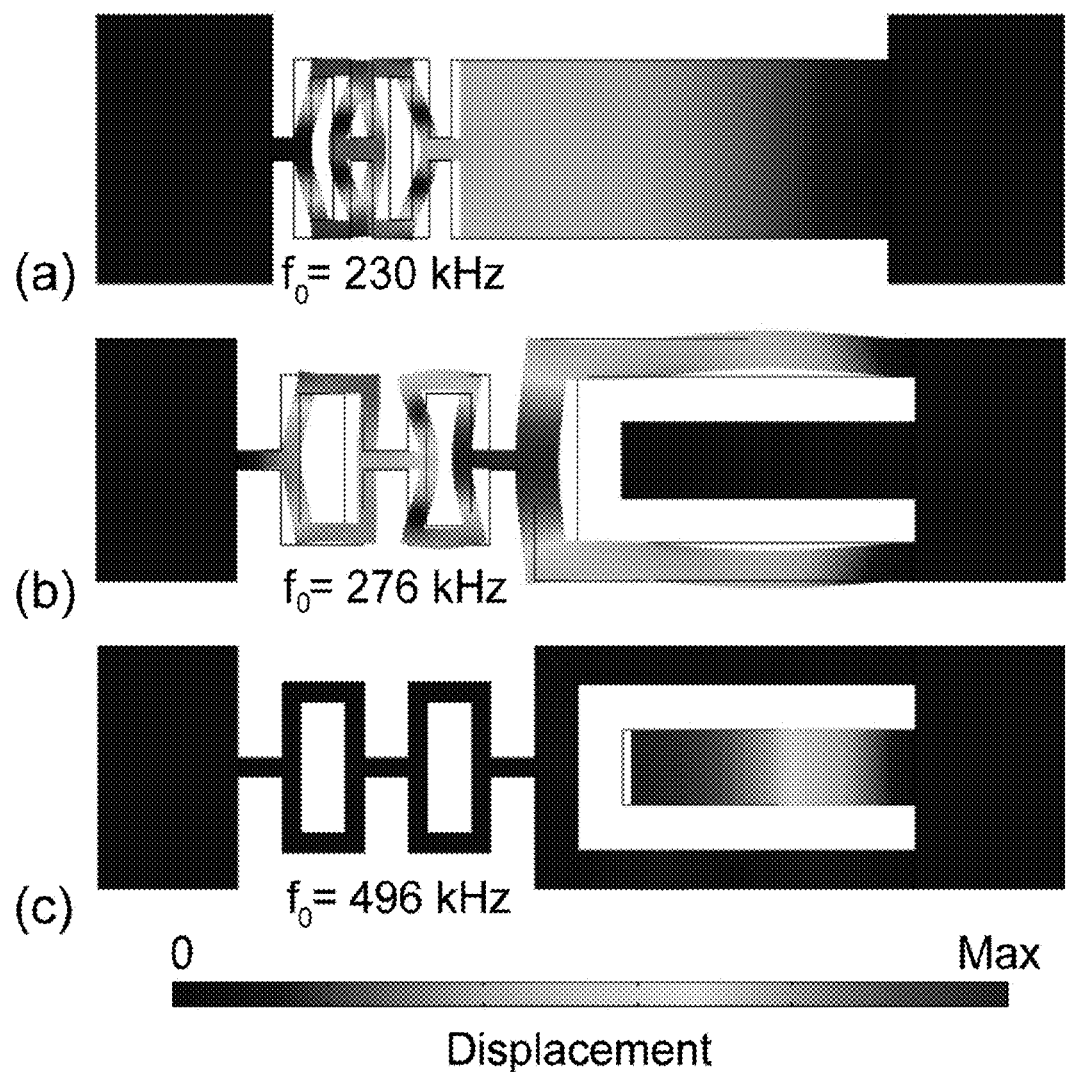
FIG. 13 depicts simulated mode shapes for (a) a single sensor such as in FIGS. 2 and 11, (b) the sensing element (primary resonator) of a differential sensor such as in FIGS. 3 and 12, and (c) the reference element (reference resonator) of a differential sensor such as in FIGS. 3 and 12.

The coupled magnetomechanical model described above was used to design and simulate the resonant frequencies and mode shapes for the experimental sensors. For the single sensor the simulated resonant frequency was 230 kHz. For the differential sensor, the resonant frequency of the primary resonator was 276 kHz, and the resonant frequency of the reference resonator was 496 kHz. The simulated mode shapes for both the single and differential sensor are shown in FIG. 13, where Young's modulus of the magnetoelastic material is assumed to be 120 GPa.

Figure 14:
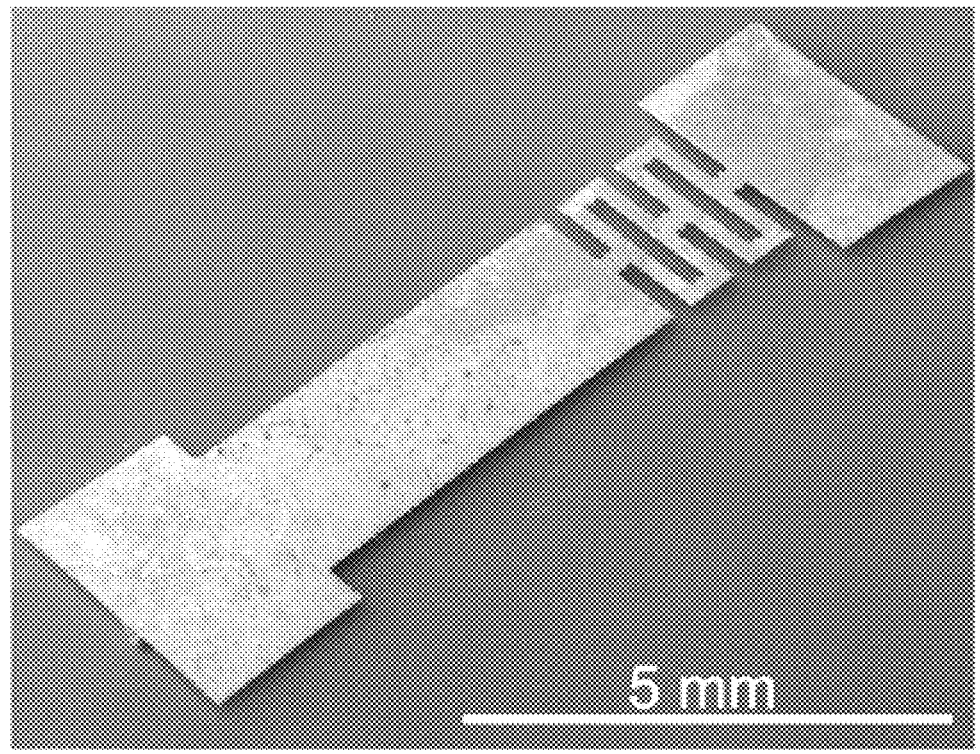
FIG. 14 is an scanning electron microscope (SEM) image of a single strain sensor such as shown in FIGS. 2 and 11.
Figure 15:
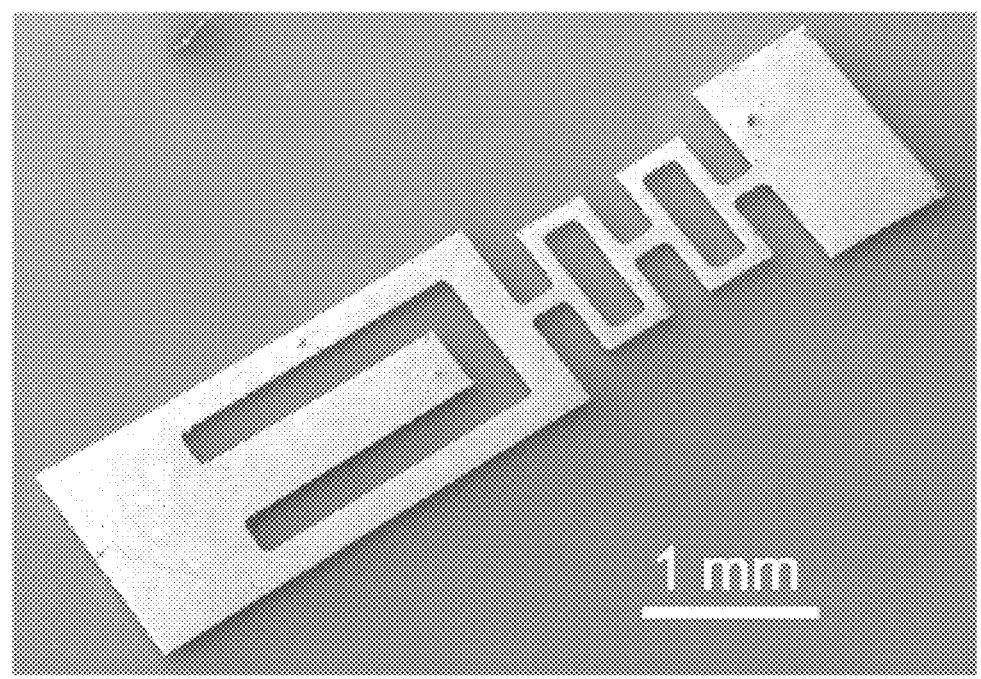
FIG. 15 is an SEM image of a differential strain sensor such as shown in FIGS. 3 and 12.
Figure 16:
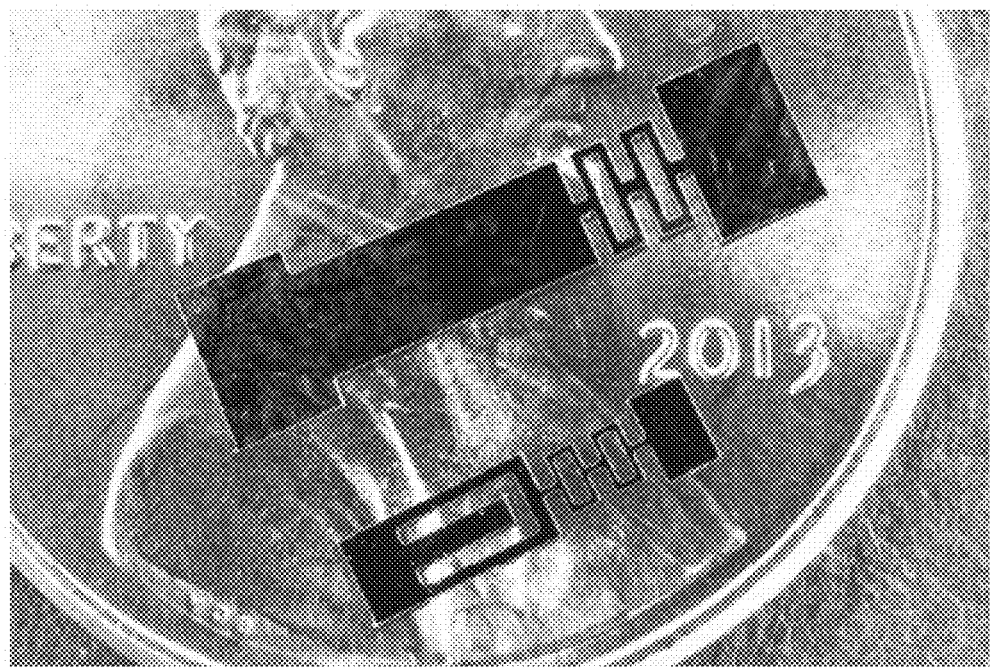
FIG. 16 is a photograph showing relative size of the strain sensors of FIGS. 14 and 15.

Micro-electrodischarge machining (μEDM) was used to fabricate the experimental sensors, as well as the biasing magnets described below. SEM images of the sensors are shown in FIGS. 14-16.

To determine the strength of the biasing field to be used with the strain sensors, the magnetoelastic resonance of each of the doubly-suspended sensors was first experimentally determined using Helmholtz coils to provide the biasing field. A biasing field of 5-10 Oe was found to be suitable for operation of the single sensor operation, and a biasing field of 15-20 Oe was found to be suitable for operation of the smaller differential sensor.

Figure 17:
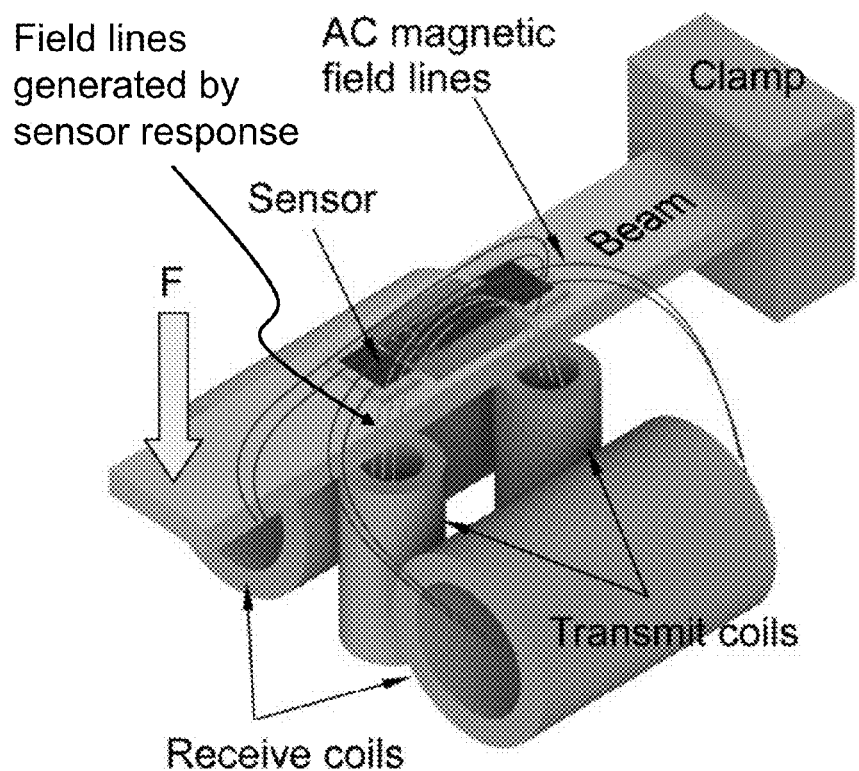
FIG. 17 schematically illustrates the test set-up used to collect data from experimental strain sensors.

FIG. 17 schematically illustrates the test set-up used to collect data from the experimental sensors. To determine the response of each sensor to applied strain, interrogation coils, including transmitting coils and receiving coils, were arranged as shown in FIG. 17. The transmitting coils were used to sweep a range of frequencies within which magnetoelastic resonance was expected. The magnetoelastic resonant frequency of each sensor was detected by an elevated response in the receiving coils. In order to excite a longitudinal mode of vibration (the X-direction of FIGS. 2 and 3), the transmitting coils were oriented such that the magnetic field lines generated by the coils looped through and along the sensor longitudinally, as shown. In order to minimize signal feedthrough, the receiving coils were positioned at a null point in the transmitted field. The transmitting coils in this particular set-up were 7 mm in diameter, 20 mm long, and had 10 turns each. The receiving coils were 45 mm in diameter, 10 mm long, and had 5 turns each. The transmitting coils were located less than 5 mm from the strain sensor. Voltage induced in the receiving coils by the sensor was read using an Agilent model 4395A network analyzer (Agilent Technologies, Santa Clara, Calif.).

For testing, the single sensor was suspended across two 300 µm thick silicon supports that spaced the sensor from the surface of the beam structure. A longitudinally magnetized Arnokrome 5 biasing magnet measuring 6 mm×3 mm was positioned beneath the suspended sensor, between the sensor and the beam. Based on magnetometer readings (Model 5180, F. W. Bell, Milwaukie, Oreg.), the biasing magnet provided the single sensor with an estimated 5-10 Oe biasing field.

The differential sensor was suspended across two stacks of three longitudinally magnetized Arnokrome 5 magnets as the supports at opposite ends of the sensor. Each biasing magnet measured 4 mm×2.5 mm. Placing the biasing magnets in direct contact with the sensor provided a stronger bias field for the sensor to operate in. The biasing magnet supports provided the differential sensor with an estimated 15-20 Oe field.

For testing, each of the sensors and the above-described biasing magnets were attached to the top surface of a brass cantilever beam, as shown in FIG. 17. Cyanoacrylate adhesive was used for all attachments. The free end of the cantilever was pushed down using a force gage to induce mechanical tensile strain in the top surface of the brass beam. A commercially available, one-axis, general purpose strain gage (SGD-5/350-LY13, Omega Engineering, Inc., Stamford, Conn.) was used with the brass beam to correlate applied force to surface strain. Temperature dependence tests were conducted by heating the sensor assembly on a hot plate. Temperature measurements were taken using a thermocouple (Type K, model 5SRTC, Omega Engineering, Inc., Stamford, Conn.) affixed to the brass beams near the sensors.

Figure 18:
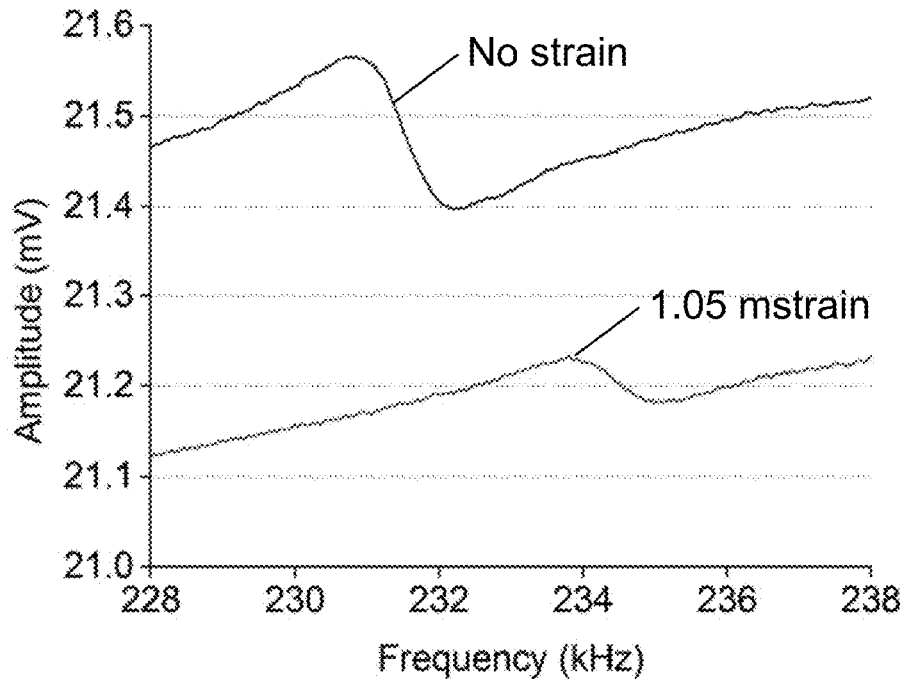
FIG. 18 is a plot showing resonance of the experimental single sensor at 23° C. under no strain and 1.05 mstrain.

FIG. 18 includes magnetoelastic resonance spectra for the single sensor at 23° C. under no strain and at 1.05 mstrain. As shown, the single sensor exhibited an unstrained magnetoelastic resonance at 230.8 kHz at 23° C. Under applied tensile strain of 1.05 mstrain, the resonant frequency increased to 233.8 kHz. The typical resonance amplitude for the unstrained single sensor was 150 µV, and under maximum strain the amplitude reduced to about 50 µV. The decrease in signal amplitude at higher strain may be due to a reduction in the small signal magnetostrictivity, d, at higher strain levels.

Figure 19:
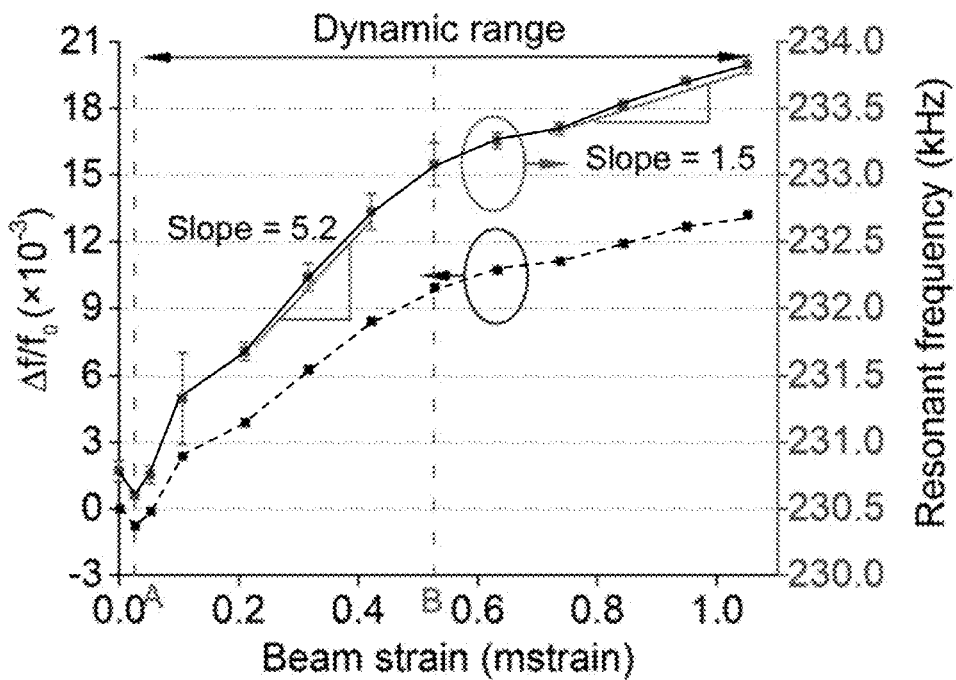
FIG. 19 includes plots of resonant frequency (solid line) and fractional change in resonant frequency (dashed line) as a function of beam strain for the experimental single sensor at 23° C.

FIG. 19 includes plots of resonant frequency (solid line) and fractional change in resonant frequency (dashed line) as a function of beam strain for the single sensor at 23° C. The average sensitivity over the illustrate strain range was about $13 \times 10^3$ ppm/mstrain. The slope of the resonant frequency curve in FIG. 19 generally decreases with increasing strain, from about 5.2 kHz/mstrain in the 0.2-0.4 mstrain range, to about 1.5 kHz/mstrain in the 0.8-1.0 mstrain range. The decreased slope at the high end of the strain range indicates saturation of the ΔE effect as described previously. The initial decrease in resonant frequency at small strains (below 50 µstrain) can be attributed to the ΔE effect in that the localized slope of the stress-strain curve (i.e. the incremental stiffness) for a magnetoelastic material does not monotonically increase with applied strain at low levels of strain. The fabricated single sensors demonstrated a dynamic range of 0.05-1.05 mstrain.

Figure 20:
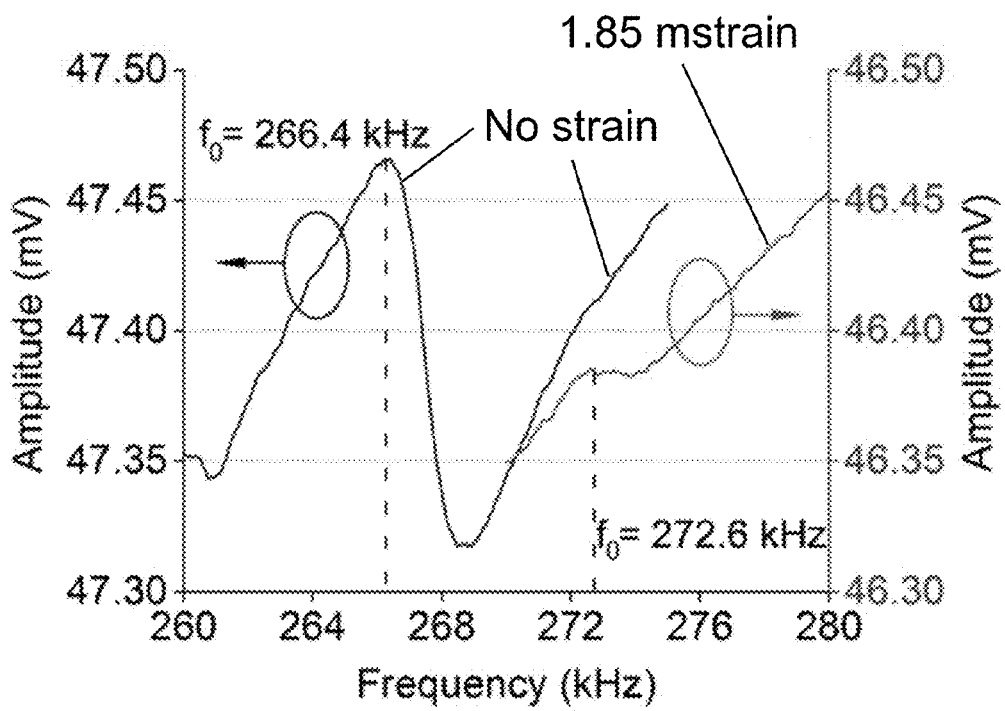
FIG. 20 includes magnetoelastic resonance spectra for the experimental differential sensor at 23° C. under no strain of the sensor and at 1.85 mstrain.

FIG. 20 includes magnetoelastic resonance spectra for differential sensor at 23° C. under no strain of the sensor and at 1.85 mstrain. As shown, a typical magnetoelastic resonance peak for the primary resonator of the differential sensor was about 266.4 kHz at 23° C. when unstrained. At an applied strain of 1.85 mstrain, the resonant frequency of the primary resonator of the differential sensor increased to 272.5 kHz, with a resulting sensitivity of about $12.5 \times 10^3$ ppm/mstrain over the illustrated strain range. The amplitude of the resonance response for the differential sensor decreased as the strain increased.

Figure 21:
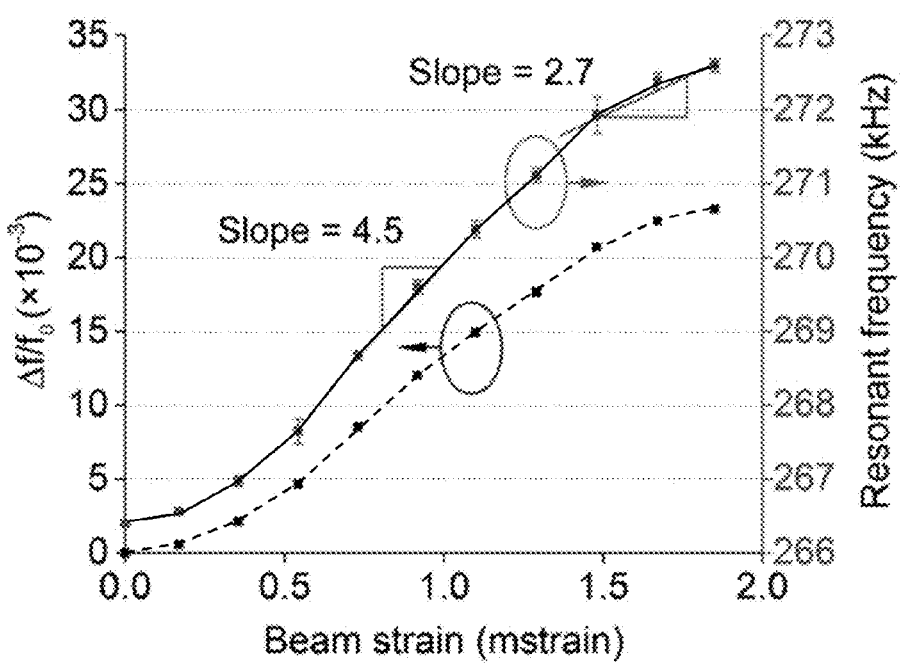
FIG. 21 includes plots of resonant frequency (solid line) and fractional change in resonant frequency (dashed line) as a function of beam strain for the experimental differential sensor at 23° C.

FIG. 21 includes plots of resonant frequency (solid line) and fractional change in resonant frequency (dashed line) as a function of beam strain for the differential sensor at 23° C. The baseline resonance amplitude was 150 µV, while at maximum applied strain the amplitude was less than 10 µV. The resonant frequency of the reference resonator was 492.75 kHz and did not change with applied strain.

The dependence of the resonant frequency on the applied strain for the differential sensor is shown in FIG. 21. Unlike the single sensor, the differential sensor did not show a reduction in resonant frequency at strains below 0.05 mstrain. This may be due to the stronger biasing field used with the differential sensor which set the baseline operating point above the initial dip in stiffness. Similar to the single sensor, the differential sensor exhibited reduced sensitivity at higher strain levels, from about 4.5 kHz/mstrain in the 0.8-1.1 mstrain range, to about 2.7 kHz/mstrain in the 1.5-1.9 mstrain range. These measurements were also taken at 23° C.

Figure 22:
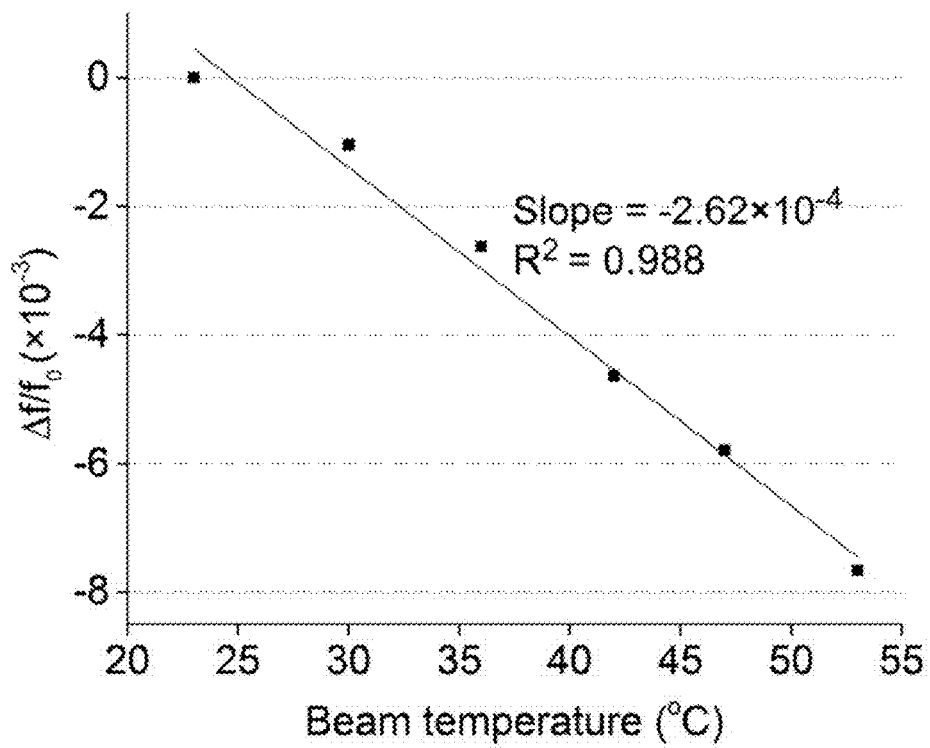
FIG. 22 shows temperature dependence of the reference resonator of the experimental differential strain sensor.
Figure 23:
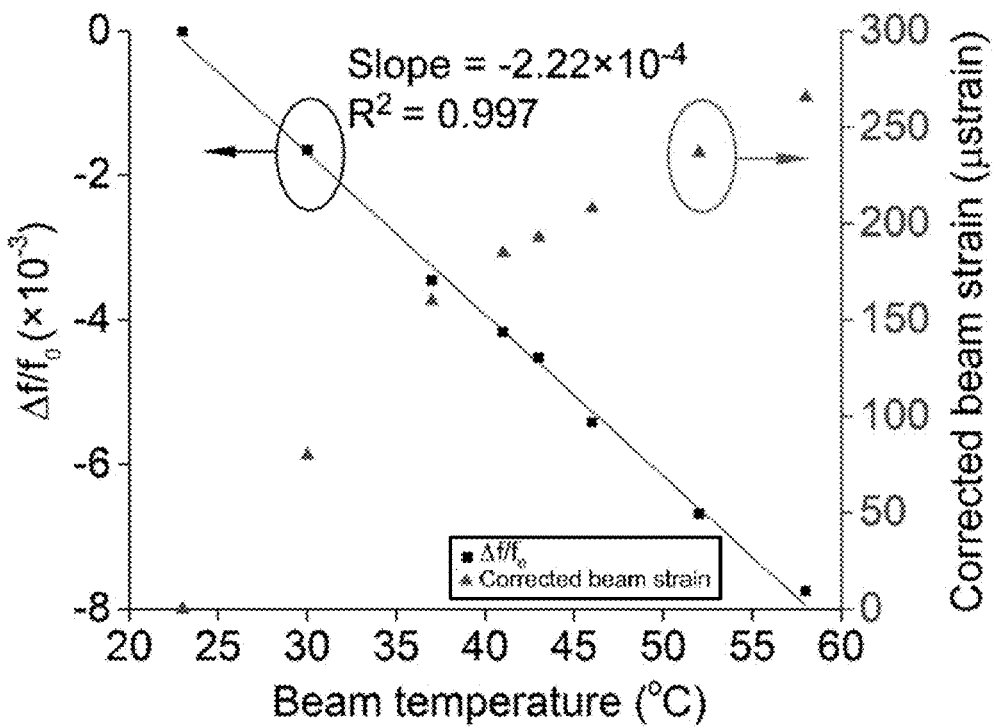
FIG. 23 shows temperature dependence of the primary resonator of the experimental differential strain sensor.
Figure 24:
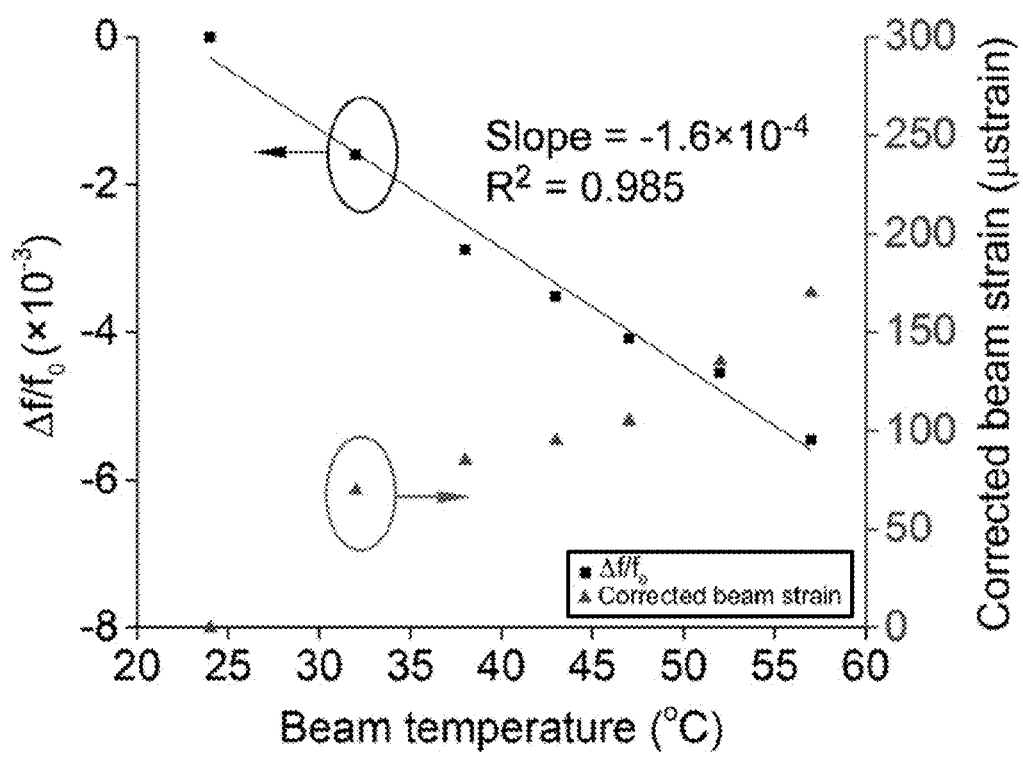
FIG. 24 shows the fractional change in resonant frequency of the experimental single sensor and corrected beam strain as a function of temperature.

As indicated in FIGS. 22 and 23, respectively, the resonant frequency of the cantilever reference resonator varied by −262 ppm/° C. and the resonant frequency of the primary resonator varied by −222 ppm/° C. (uncorrected by the output of the reference element) over the same temperature range—from about 20° C. to 60° C. Based on this and on equation (6), the true or corrected strain observed in the sensor is plotted in FIG. 23. When the temperature compensation provided by the reference resonator is applied to the simple sensor, its temperature coefficient of resonant frequency changes from −160 ppm/° C. uncorrected to 102 ppm/° C. corrected, as indicated in FIG. 24.

As demonstrated, the use of an active area in the strain sensor that exhibits controlled, non-uniform strain behavior, as is the case with the resonator and compliance elements described above, enables the design of a strain sensor with a wide dynamic range and with a strain range that is more useful in practical applications, such as dental and medical implants to provide real time strain measurements of bone/palate expanders, structural integrity monitoring in buildings and bridges, and automotive applications such as wireless tire pressure sensing. The above-described compliance element, for instance, allows for a trade-off between the sensitivity of the sensor and the dynamic range, with more compliant springs offering larger dynamic ranges. Though the experimental single sensor described above exhibits an initial reduction in the resonant frequency at strain values below 0.05 mstrain, a stronger biasing field can be used to increase the initial magnetization (and stiffness) of the magnetoelastic material to shift the baseline resonant frequency away from this initial dip in material stiffness. Mechanically pre-straining the sensor can have the same effect. Use of an even stronger biasing field or higher pre-strain can allow baseline operation in a range (e.g., point B in FIG. 19) where the sensor can detect both tensile and compressive strain.

Regarding temperature effects on sensor behavior, a change in temperature generally affects the resonant frequency of a cantilever through a change in Young's modulus and/or dimensional changes due to thermal expansion. For a cantilever resonating in the longitudinal mode, the resonant frequency is given by:

$$f_0 = \frac{1}{4L}\sqrt{\frac{E}{\rho(1-v^2)}} \quad (7)$$

where E is Young's modulus, $\rho$ is density, $v$ is Poisson's ratio, and L is the length of the cantilever. The fractional change in resonant frequency resulting from a temperature change can be expressed as:

$$S_\varepsilon(T)\Delta T = \frac{\frac{1}{4L(1+\alpha_{TE}\Delta T)}\sqrt{\frac{E(1+\alpha_\gamma \Delta T)(1+\alpha_{TE}\Delta T)^3}{\rho(1-v^2)}} - \frac{1}{4L}\sqrt{\frac{E}{\rho(1-v^2)}}}{\frac{1}{4L}\sqrt{\frac{E}{\rho(1-v^2)}}} \quad (8)$$

where $\Delta T$ is the temperature change, $\alpha_{TE}$ is the thermal expansion coefficient, and $\alpha_\gamma$ is the fractional change, with temperature, in Young's modulus. For Metglas 2826MB, the thermal expansion coefficient ($\alpha_{TE}$=12 ppm/° C.) is negligible compared to the measured $\Delta f/f_0$ and can thus be ignored for the temperature range under consideration. Equation (8) then simplifies to:

$$S_\varepsilon(T) \approx \frac{1}{\Delta T}(\sqrt{(1+\alpha_\gamma T)} - 1) \approx \frac{\alpha_\gamma}{2} \quad (9)$$

From experimental results, $S_\varepsilon(T)$ is −262 ppm/° C., which implies that $\alpha_\gamma$ is −524 ppm/° C.

Young's modulus for Metglas 2826MB decreases with increasing temperature, lowering the resonant frequency. In contrast, the expansion mismatch of brass and Metglas 2826MB, with respective thermal expansion coefficients of 19 ppm/° C. and 12 ppm/° C., results in tensile strain, assuming that the stain sensor and the brass beam are at similar temperatures. These factors thus influence the resonant frequency of the sensors in an opposing manner. For the above-referenced experimental single sensor, there is a decrease of 1.27 kHz in the resonant frequency for a 35° C. increase in temperature. This substantial decrease in resonant frequency with increasing temperature indicates that the decrease in Young's modulus of the magnetoelastic material 2826MB is a significant parameter influencing the magnetoelastic resonant frequency. Considering that the full range of frequencies for the tested single sensor, observed over the range of applied strain, is about 3 kHz, the temperature variation should be factored into the measurements. For the fabricated differential sensor, the resonant frequency falls by 1.85 kHz for a 35° C. increase in temperature. Temperature compensation using the response of the reference resonator enables the calculation of the tensile strain caused by the temperature change. The differential sensor and the single sensor exhibited respective strain dependencies on temperature of 7.45 μstrain/° C. (ppm/° C.) and 4.52 μstrain/° C. (ppm/° C.). This corresponds well with the theoretical expansion mismatch of 7 ppm/° C. between brass and the Metglas 2826MB used to fabricate the sensors.

It is to be understood that the foregoing description is of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, where Metglas 2826MB is used for a sensor subject to high humidity environments, a thin layer of Parylene-C can be deposited to prevent corrosion of the material. Also, where the sensor is used on a ferromagnetic substrate, the sensor reading by the interrogating coil(s) can be influenced by the substrate, and this can be accommodated by calibration of the sensor on a similar substrate. All such other embodiments, changes, and modifications are intended to come within the scope of the appended claims.

As used in this specification and claims, the terms "for example," "e.g.," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A strain sensor for measuring the strain at an area of interest of a structure, the strain sensor comprising:
   an active area between first and second anchors, each anchor being configured for rigid attachment to the structure at a boundary of the area of interest,
   wherein the active area of the sensor comprises a magnetoelastic material and is configured so that the strain induced in the active area of the sensor by movement of the anchors relative to each other is non-uniform, and so that at least a portion of the active area comprising the magnetoelastic material has a resonant vibrational frequency that is dependent on strain.

2. A strain sensor as defined in claim 1, wherein the active area of the sensor comprises:
   a resonator comprising the magnetoelastic material, the resonator having a resonant vibrational frequency that is dependent on strain; and
   a compliance element coupled with the resonator and configured so that the compliance element undergoes a greater amount of strain than the resonator when the active area of the sensor is under load.

3. A strain sensor as defined in claim 2, wherein the resonator and the compliance element have different shapes.

4. A strain sensor as defined in claim 2, wherein the compliance element is configured to undergo a portion of the strain in the active region that is sufficient to cause the resonator to remain in a strain-dependent resonant frequency strain range during use and thereby provide the sensor with a pre-determined dynamic range.

5. A strain sensor as defined in claim 2, wherein the compliance element comprises the magnetoelastic material.

6. A strain sensor as defined in claim 2, further comprising a strain-independent reference resonator.

7. A strain sensor as defined in claim 2, wherein the resonator extends from the first anchor to the compliance element, the compliance element extending from the second anchor to the resonator.

8. A strain sensor as defined in claim 7, further comprising a reference resonator comprising the magnetoelastic material, the reference resonator extending from the first anchor to a free end, wherein the resonator is separated from the reference resonator by a relief area formed through the magnetoelastic material.

9. A strain sensor as defined in claim 1, wherein the strain sensor is formed monolithically as a strip of the magnetoelastic material with one or more relief areas formed through a portion of the strip in the active area.

10. A strain sensor as defined in claim 1, further comprising at least one additional anchor that is not aligned with the first and second anchors, the at least one additional anchor being configured for rigid attachment the structure at the boundary of the area of interest and coupled with the active area of the sensor, whereby the active area of the sensor can undergo strain in more than one direction and thereby measure strain at the area of interest of the structure in more than one direction.

11. A method of measuring strain at an area of a structure, comprising the step of measuring the response of an active area of a strain sensor at a vibrational frequency of interest, wherein the strain sensor is attached to the area of the structure, the active area of the strain sensor comprises a magnetoelastic material, and the active area exhibits strain that is non-uniformly distributed over the active area.

12. The method of claim 11, wherein the active area of the strain sensor is magnetically biased.

13. The method of claim 11, further comprising the step of determining a resonant vibrational frequency of the active area of the strain sensor by measuring the response of the active area of the strain sensor at a plurality of vibrational frequencies within a range of vibrational frequencies.

14. The method of claim 13, further comprising the step of sequentially exciting the active area of the strain sensor at each of the plurality of vibrational frequencies.

15. The method of claim 13, further comprising the step of simultaneously exciting the active area of the strain sensor at each of the plurality of vibrational frequencies.

16. The method of claim 11, further comprising the step of electromagnetically inducing vibration in the active area of the strain sensor at the frequency of interest.

17. The method of claim 11, wherein the active area exhibits strain that is non-uniformly distributed over the active area when the strain at the area of the structure is uniform.

18. The method of claim 11, wherein the active area exhibits strain that is non-uniformly distributed over the active area when the strain at the area of the structure is static.

19. The method of claim 11, wherein the active area has a resonant vibrational frequency that is dependent on strain.

20. The method of claim 11, wherein the active area extends between anchors that are rigidly attached to the structure along the area of the structure.

* * * * *